United States Patent
Jang et al.

(10) Patent No.: US 12,225,746 B2
(45) Date of Patent: Feb. 11, 2025

(54) LIGHT EMITTING DEVICE, PRODUCTION METHOD THEREOF, AND DISPLAY DEVICE INCLUDING THE SAME

(71) Applicant: SAMSUNG ELECTRONICS CO., LTD., Suwon-si (KR)

(72) Inventors: Hyo Sook Jang, Suwon-si (KR); Eun Joo Jang, Suwon-si (KR); Ilyoung Lee, Yongin-si (KR); Tae Ho Kim, Seongnam-si (KR); Kun Su Park, Seongnam-si (KR); Jun-Mo Yoo, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 551 days.

(21) Appl. No.: 17/515,652

(22) Filed: Nov. 1, 2021

(65) Prior Publication Data

US 2022/0140272 A1 May 5, 2022

(30) Foreign Application Priority Data

Oct. 30, 2020 (KR) .................... 10-2020-0143673

(51) Int. Cl.
*H10K 50/115* (2023.01)
*B82Y 20/00* (2011.01)
*B82Y 40/00* (2011.01)
*C09K 11/88* (2006.01)
*H10K 85/30* (2023.01)

(52) U.S. Cl.
CPC .......... *H10K 50/115* (2023.02); *C09K 11/883* (2013.01); *H10K 85/381* (2023.02); *B82Y 20/00* (2013.01); *B82Y 40/00* (2013.01)

(58) Field of Classification Search
CPC .. H10K 50/115; H10K 85/381; C09K 11/883; B82Y 20/00; B82Y 40/00
See application file for complete search history.

(56) References Cited

U.S. PATENT DOCUMENTS 10,923,668 B2   2/2021 Park et al.
2018/0277778 A1* 9/2018 Pentlehner ............. H10K 50/19
(Continued)

FOREIGN PATENT DOCUMENTS

JP    5817150 B2   11/2015
JP    6334216 B2   5/2018
(Continued)

*Primary Examiner* — Fernando L Toledo
*Assistant Examiner* — Marshall Mu-Nuo Hatfield
(74) *Attorney, Agent, or Firm* — CANTOR COLBURN LLP

(57) ABSTRACT

A light emitting device and a production method thereof. The light emitting device includes a light emitting layer including a plurality of quantum dots, and an electron auxiliary layer disposed on the light emitting layer, the electron auxiliary layer configured to transport electrons, inject electrons into the light emitting layer, or a combination thereof, wherein the electron auxiliary layer includes a plurality of metal oxide nanoparticles and a nitrogen-containing metal complex. The metal oxide nanoparticles include zinc and optionally a dopant metal, the dopant metal includes Mg, Co, Ga, Ca, Zr, W, Li, Ti, Y, Al, Co, or a combination thereof and a mole ratio of nitrogen to zinc in the electron auxiliary layer is greater than or equal to about 0.001:1.

20 Claims, 2 Drawing Sheets

(56) References Cited

U.S. PATENT DOCUMENTS

| | | | |
|---|---|---|---|
| 2019/0181354 A1* | 6/2019 | Shin | H10K 59/805 |
| 2019/0280233 A1* | 9/2019 | Kim | H10K 85/151 |
| 2019/0288229 A1 | 9/2019 | Kim et al. | |
| 2020/0035857 A1 | 1/2020 | Park et al. | |
| 2020/0243616 A1* | 7/2020 | Boardman | H10K 59/351 |
| 2020/0321547 A1* | 10/2020 | Wu | H10K 50/80 |
| 2020/0343461 A1* | 10/2020 | Hummert | C07F 3/06 |

FOREIGN PATENT DOCUMENTS

| | | | | |
|---|---|---|---|---|
| KR | 20150121355 A | * | 10/2015 | H10K 50/165 |
| KR | 20190108504 A | | 9/2019 | |
| KR | 20200021726 A | | 3/2020 | |

* cited by examiner

LIGHT EMITTING DEVICE, PRODUCTION METHOD THEREOF, AND DISPLAY DEVICE INCLUDING THE SAME

CROSS-REFERENCE TO RELATED APPLICATION

This application claims priority to and the benefit of Korean Patent Application No. 10-2020-0143673 filed in the Korean Intellectual Property Office on Oct. 30, 2020, and all the benefits accruing therefrom under 35 U.S.C. § 119, the content of which in its entirety is herein incorporated by reference.

BACKGROUND

1. Field

A light emitting device, a production method thereof, and a display device including the same are disclosed.

2. Description of the Related Art

Physical characteristics (e.g., bandgap energies, melting points, etc.) of nanoparticles that are intrinsic characteristics may be controlled by changing the particle sizes of the of nanoparticles, unlike bulk materials. For example, semiconductor nanocrystals also known as quantum dots may be supplied with photoenergy or electrical energy and may emit light in a wavelength corresponding to sizes of the quantum dots. Accordingly, the quantum dots may be used as a light emitting body emitting light of a particular wavelength.

SUMMARY

An electroluminescent device can use quantum dots as a light emitting body. However, since the light emitting principle of quantum dots in the electroluminescent device is different from that of the light emitting material of the prior art, a new solution to improve the performance of the light emitting device is desired.

An embodiment provides a light emitting device capable of implementing improved performance.

An embodiment provides a display device including the light emitting device.

A light emitting device according to an embodiment includes a light emitting layer including a plurality of quantum dots, and an electron auxiliary layer disposed on the light emitting layer, the electron auxiliary layer configured to transport electrons, inject electrons into the light emitting layer, or a combination thereof, wherein the electron auxiliary layer includes a plurality of metal oxide nanoparticles and a nitrogen-containing metal complex, the metal oxide nanoparticles include zinc and optionally a dopant metal, wherein the dopant metal includes an alkali metal, an alkaline-earth metal, a Group IIIB metal, a Group IVB metal, a Group IIIA metal, cobalt, tungsten, or a combination thereof, the nitrogen-containing metal complex includes zinc, and a mole ratio of nitrogen to zinc in the electron auxiliary layer is greater than or equal to about 0.001:1.

The plurality of quantum dots or the light emitting layer may not include cadmium, lead, or a combination thereof.

The plurality of quantum dots may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The metal oxide nanoparticles may have an average particle size of greater than or equal to about 1 nanometer (nm) and less than or equal to about 10 nm. The average size of the metal oxide nanoparticles may be greater than or equal to about 3 nm and less than or equal to about 6 nm.

The electron auxiliary layer may have a first ultraviolet (UV) absorption peak wavelength of less than or equal to about 350 nm, less than or equal to about 345 nm, or less than or equal to about 340 nm. The electron auxiliary layer may have a first UV absorption peak wavelength of greater than or equal to about 290 nm, greater than or equal to about 300 nm, greater than or equal to about 310 nm, greater than or equal to about 320 nm, greater than or equal to about 325 nm, or greater than or equal to about 330 nm.

The nitrogen-containing metal complex may further include magnesium, lithium, aluminum, gallium, cobalt, yttrium, nickel, or a combination thereof.

The dopant metal may include lithium, sodium, potassium, rubidium, cesium, magnesium, calcium, strontium, barium, scandium, yttrium, titanium, zirconium, hafnium, aluminum, gallium, indium, thallium, cobalt, tungsten, or a combination thereof.

In the electron auxiliary layer, a mole content of nitrogen per 1 mole of zinc may be greater than or equal to about 0.005, greater than or equal to about 0.01, or greater than or equal to about 0.05.

In the electron auxiliary layer, a mole content of carbon per 1 mole of zinc may be greater than or equal to about 0.009, greater than or equal to about 0.01, greater than or equal to about 0.05, greater than or equal to about 0.09, greater than or equal to about 0.1, greater than or equal to about 0.5, or greater than or equal to about 0.9.

The electron auxiliary layer may have an organic material content (e.g., in weight percent) of greater than or equal to about 20% and less than or equal to about 40% as determined by thermogravimetric analysis.

The electron auxiliary layer may include an oxygen-containing polar ligand having 6 or less carbon atoms.

The oxygen-containing polar ligand may include a carboxylate group, a carbonyl group, an ester group, a hydroxyl group, an alkoxy group, or a combination thereof.

The oxygen-containing polar ligand may include an acetate group, an acetylacetonate group, a hydroxide group, an alkoxide group, a formate moiety, or a combination thereof.

The electron auxiliary layer may include a nitrogen-containing polar ligand having 6 or less carbon atoms. The nitrogen-containing polar ligand may include an alkylamine moiety, a hydroxy alkylamine moiety, or a combination thereof.

The metal oxide nanoparticles may include a compound represented by Chemical Formula 1:

$$Zn_{1-x}M_xO$$

wherein, M is Mg, Ca, Zr, Co, W, Li, Ti, Y, Al, or a combination thereof, and $0 \leq x \leq 0.5$.

The light emitting device may emit blue light.

The light emitting device may exhibit a maximum external quantum efficiency of greater than or equal to about 10%.

The light emitting device may exhibit a maximum luminance of greater than or equal to about 35,000 candelas per square meter ($cd/m^2$).

The light emitting device may exhibit a T90 of greater than or equal to about 10 hours, or greater than or equal to about 15 hours.

The light emitting device may have a T50 of greater than or equal to about 55 hours.

In an embodiment, a method of producing the aforementioned light emitting device includes, dissolving a first zinc precursor and optionally a further metal precursor (e.g., a precursor including magnesium, lithium, aluminum, gallium, cobalt, yttrium, nickel, or a combination thereof) in an organic solvent in the presence of a nitrogen-containing (for example, multi-functional) organic compound and stirring the resultant at a predetermined temperature to form a nitrogen-containing metal complex;

dispersing the nitrogen-containing metal complex and the metal oxide nanoparticles in a polar solvent to obtain a mixed coating liquid; and coating the mixed coating liquid (e.g., on the light emitting layer) and removing the polar solvent.

The temperature may be less than or equal to about 100° C. The stirring may be performed for greater than or equal to about 1 hour and less than or equal to about 30 hours.

The first zinc precursor and optionally the additional metal precursor may include a C6 or less carboxylate moiety, an acetylacetonate group, a hydroxide group, an alkoxide group, a formate moiety, or a combination thereof.

The nitrogen-containing multi-functional organic compound may include a compound having 6 or less carbon atoms, the compound having 6 or less carbon atoms including an amine group and a hydroxyl group.

The organic solvent may include an alcohol, e.g., an alkoxy alcohol, alkylene glycol, or a combination thereof.

The nitrogen-containing metal complex may exhibit solubility in a polar solvent.

In an embodiment, a stacked structure includes a layer including a plurality of metal oxide nanoparticles and a nitrogen-containing zinc complex, the metal oxide nanoparticles include zinc and optionally a dopant metal, wherein the dopant metal includes an alkaline metal, an alkaline-earth metal, a Group IIIB metal, a Group IVB metal, a Group IIIA metal, cobalt, tungsten, or a combination thereof, and a mole ratio of nitrogen to zinc in the layer may be greater than or equal to about 0.001:1, or greater than or equal to about 0.005:1, or greater than or equal to about 0.01:1.

The layer may include a first surface and a second surface opposite to the first surface, and a conductor capable of providing electrons may be disposed on the first surface.

A light emitting layer including a plurality of quantum dots may be disposed on the second surface.

The nitrogen-containing zinc complex may be represented by Chemical Formula 2:

$$ZnM_a(L1)_x(L2)_y \quad \text{Chemical Formula 2}$$

wherein

M is Mg, Ca, Zr, Co, W, Li, Ti, Y, Al, or a combination thereof,

L1 represents a C6 or less oxygen-containing organic ligand,

L2 represents a C6 or less nitrogen-containing organic ligand,

L1 and L2 may optionally be linked to each other,

"a, x, and y" represents a number of moles of M, L1, and L2 relative to zinc (e.g., one mole of zinc), respectively, wherein $0 \leq a \leq 1$, for example, a is greater than 0, greater than or equal to about 0.001, greater than or equal to about 0.005, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9, and less than or equal to about 1, and less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1

$0 \leq x \leq 1$, for example, x is greater than 0, greater than or equal to about 0.001, greater than or equal to about 0.005, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9, and less than or equal to about 1, and less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1, and $0 \leq y \leq 1$, for example, y is greater than 0, greater than or equal to about 0.001, greater than or equal to about 0.005, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9, and less than or equal to about 1, and less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1, provided that x and y are not zero simultaneously.

The L1 may include an acetate group, an alkoxide group, a hydroxy group, a formate group, an acetylacetonate group, or a combination thereof.

The L2 may include a hydroxyalkyl amine moiety, an alkylamine moiety, an ammonium salt moiety, or a combination thereof.

In the layer, a mole content of nitrogen per 1 mole of zinc may be greater than or equal to about 0.001, greater than or equal to about 0.005, or greater than or equal to about 0.1.

In the layer, a mole content of carbon per 1 mole of zinc may be greater than or equal to about 0.9 and less than or equal to about 2.

In the layer, a content of the nitrogen-containing zinc complex may be less than or equal to about 50 weight percent (wt %), based on the total weight of the layer.

An embodiment provides a display device including the aforementioned light emitting device or the aforementioned stacked structure.

In a device (e.g., an electroluminescent device) according to an embodiment, the electron auxiliary layer may be formed by a low-temperature process, and may exhibit improved morphology and improved thin film quality, and may contribute to improvement of life-span of the device. A device according to an embodiment may exhibit increased light emitting characteristics. The light emitting device or the stacked structure according to an embodiment may be applied to, e.g., used in, various semiconductor devices such as various display devices, light emitting diode devices, sensors, lasers, and solar energy devices.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
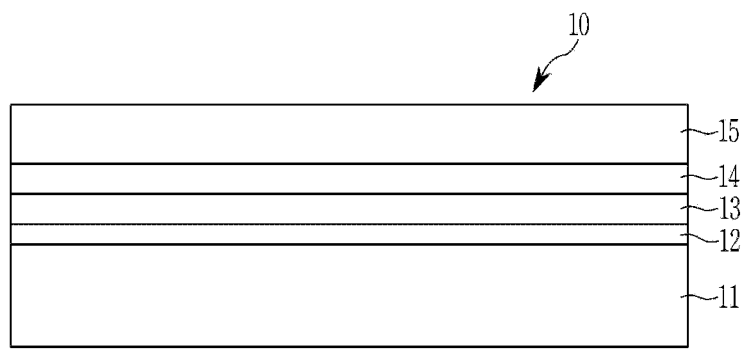
FIG. 1A is a cross-sectional view schematically illustrating a light emitting device according to an embodiment.

Hereinafter, embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, a description of not including cadmium (or other toxic heavy metals) means that the concentration of cadmium (or the corresponding heavy metal) is less than or equal to about 100 ppm (by weight), less than or equal to about 50 ppm, less than or equal to about 10 ppm, less than or equal to about 1 ppm, less than or equal to about 0.1 ppm, less than or equal to about 0.01 ppm, or almost about 0. In an embodiment, substantially no cadmium (or its heavy metal) is present, or, if present, in an amount below the detection limit of a given detection means or at an impurity level.

Hereinafter, a value of a work function, conduction band, or lowest unoccupied molecular orbital (LUMO) (or valence band or highest occupied molecular orbital (HOMO)) energy level is expressed as an absolute value from a vacuum level. In addition, a deep, a high, or large work function or energy level means that the absolute value is large when the vacuum level is set to "0 electronvolts (eV)," and a shallow, low, or small work function or energy level means that the absolute value is small when the vacuum level is set to "0 eV."

As used herein, the term "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, rutherfordium, or the like, but are not limited thereto. As used herein, "metal" includes a semi-metal such as Si.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, when a definition is not otherwise provided, "substituted" refers to replacement of hydrogen of a compound, a group, or moiety by a substituent such as a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenylester group (e.g., acrylate group, methacrylate group), a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a 01 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hydrocarbon group" refers to a group including carbon and hydrogen (e.g., alkyl, alkenyl, alkynyl, or aryl group). The hydrocarbon group may be a group having a monovalence or more formed by removal of one or more hydrogen atoms from alkane, alkene, alkyne, or arene. In the hydrocarbon group, a, e.g., at least one, methylene may be replaced by an oxide moiety, a carbonyl moiety, an ester moiety, —NH—, or a combination thereof. Unless otherwise stated to the contrary, the hydrocarbon (alkyl, alkenyl, alkynyl, or aryl) group may have 1 to 60, 2 to 32, 3 to 24, or 4 to 12 carbon atoms.

As used herein, "aliphatic" refers to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having a carbon-carbon double bond.

As used herein, when a definition is not otherwise provided, "alkynyl" refers to a linear or branched monovalent hydrocarbon group having a carbon-carbon triple bond.

As used herein, when a definition is not otherwise provided, "aryl" refers to a group formed by removal of a, e.g., at least one, hydrogen from an arene (e.g., a phenyl or naphthyl group).

As used herein, when a definition is not otherwise provided, "hetero" refers to including 1 to 3 heteroatoms, e.g., N, O, S, Si, P, or a combination thereof.

As used herein, when a definition is not otherwise provided, "alkoxy" means an alkyl group linked via an oxygen (i.e., alkyl-O—), such as a methoxy, ethoxy, or sec-butyloxy group.

As used herein, when a definition is not otherwise provided, an "amine group" may be —NRR (wherein R is independently hydrogen, a C1 to C12 alkyl group, a C7 to C20 alkylarylene group, or a C7 to C20 arylalkylene group, or a C6 to C18 aryl group).

Hereinafter, a light emitting device and a stacked structure according to an embodiment will be described with reference to the drawings.

FIG. 1A is a cross-sectional view schematically illustrating a light emitting device according to an embodiment. Referring to FIG. 1A, the light emitting device 10 according to an embodiment includes a light emitting layer 13 including a plurality of quantum dots, and an electron auxiliary layer 14 disposed on the light emitting layer 13 and configured to transport electrons (e.g., into the light emitting layer 13), inject electrons into the light emitting layer 13, or a combination thereof, and including metal oxide nanoparticles and a nitrogen-containing metal complex. A stacked structure according to an embodiment includes a layer including metal oxide nanoparticles and a nitrogen-containing metal complex.

The light emitting layer 13 includes (e.g., a plurality of) quantum dots (hereinafter also referred to as semiconductor nanocrystals). In an embodiment, the quantum dots may not include cadmium. The quantum dots may not include lead, mercury, or a combination thereof. The quantum dots may have a core-shell structure, and may include a core including a first semiconductor nanocrystal and a shell including a second semiconductor nanocrystal disposed on the core and having a composition different from that of the first semiconductor nanocrystal.

The quantum dots (in the core-shell structure, the first semiconductor nanocrystal, the second semiconductor nanocrystal, or a combination thereof) may include a Group II-VI compound, a Group III-V compound, a Group IV-VI compound, a Group IV element or compound, a Group compound, a Group compound, a Group I-II-IV-VI compound, or a combination thereof. The light emitting layer may not include harmful heavy metals such as cadmium, lead, mercury, or a combination thereof.

The Group II-VI compound may be a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal. The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP). The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof. Examples of the Group compound may be $CuInSe_2$, $CuInS_2$, CuInGaSe, and CuInGaS, but are not limited thereto. Examples of the Group I-II-IV-VI compound may be CuZnSnSe, and CuZnSnS, but are not limited thereto. The Group IV element or compound may include a single-element compound such as Si, Ge, or a combination thereof; a binary element compound such as SiC, SiGe, or a combination thereof; or a combination thereof.

In an embodiment, the quantum dots or core (e.g., the first semiconductor nanocrystal) may include a metal including indium, zinc, or a combination thereof and a non-metal including phosphorus, selenium, tellurium, sulfur, or a combination thereof. The core may be a light emitting center. In an embodiment, the second semiconductor nanocrystal may include a metal including indium, zinc, or a combination thereof, and a non-metal including phosphorus, selenium, tellurium, sulfur, or a combination thereof. In an embodiment, the first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof; or a combination thereof.

In an embodiment, the quantum dots may emit blue or green light and may include a core including ZnSeTe, ZnSe, or a combination thereof and a shell including ZnSeS. A content of sulfur in the shell may increase or decrease in a radial direction (from the core toward the surface), e.g., the content of sulfur may have a concentration gradient wherein the concentration of sulfur varies radially (e.g., decreases or increases toward the core). In an embodiment, the shell may include zinc, sulfur, and optionally selenium in the outermost layer. In an embodiment, the quantum dots may emit red or green light, the core may include InP, InZnP, or a combination thereof, and the shell may include a Group II metal including zinc and a non-metal including sulfur, selenium, or a combination thereof.

In an embodiment, when the quantum dots have a core-shell structure, on the interface between the core and the shell, an alloyed interlayer may be present or may not be present. The alloyed layer may include a homogeneous alloy or may have a concentration gradient. The gradient alloy may have a concentration gradient wherein the concentration of an element of the shell varies radially (e.g., decreases or increases toward the core).

In an embodiment, the shell may have a composition that varies in a radial direction. In an embodiment, the shell may be a multilayered shell including two or more layers. In the multilayered shell, adjacent two layers may have different compositions from each other. In the multilayered shell, a, e.g., at least one, layer may independently include a semiconductor nanocrystal having a single composition. In the multilayered shell, a, e.g., at least one, layer may independently have an alloyed semiconductor nanocrystal. In the multilayered shell, a, e.g., at least one, layer may have a concentration gradient that varies radially in terms of a composition of a semiconductor nanocrystal.

In the core-shell quantum dot, the materials of the shell may have a bandgap energy that is larger, e.g., greater, than that of the core, but it is not limited thereto. The materials of the shell may have a bandgap energy that is smaller, e.g., less, than that of the core. In the case of the multilayered shell, the bandgap energy of the outermost layer material of the shell may be greater than the bandgap energies of the core and the inner layer material of the shell (layers that are closer to the core). In the case of the multilayered shell, a semiconductor nanocrystal of each layer is selected to have an appropriate bandgap, thereby effectively showing, e.g., exhibiting, a quantum confinement effect.

The quantum dots according to an embodiment may include, for example, an organic ligand and, optionally, a halogen moiety, which are bonded or coordinated to the surface.

The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof. Herein, R is each independently a C3 to C40 substituted or unsubstituted aliphatic hydrocarbon group (e.g., alkyl, alkenyl, alkynyl, etc.), a C6 to C40 substituted or unsubstituted aromatic hydrocarbon group (e.g., aryl group), or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide, and the like; a diphenyl phosphine compound, a triphenyl phosphine compound, or an oxide compound thereof; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid, and the like; a C5 to C20 alkyl phosphonic acid; and the like, but are not limited thereto.

The halogen moiety may be chlorine, bromine, iodine, or a combination thereof. The halogen residue may include chlorine.

In an embodiment, the quantum dots may include a first organic ligand and a halogen on the surface, and the first organic ligand may include a C6 to C40 aliphatic carboxylic acid compound (e.g., myristic acid, oleic acid, stearic acid, etc.). The carboxylic acid compound may include a compound represented by RCOOH (wherein, R is an alkyl group of C12 or more or an alkenyl group of C12 or more).

When the quantum dots of an embodiment includes a halogen moiety, the content of halogen may be greater than or equal to about 1 microgram (μg), for example, greater than or equal to about 2 μg, greater than or equal to about 3 μg, greater than or equal to about 4 μg, greater than or equal to about 5 μg, greater than or equal to about 6 μg, or greater than or equal to about 7 μg and less than or equal to about 12.5 μg, for example, less than or equal to about 12.4 μg, less than or equal to about 12.3 μg, less than or equal to about 12.2 μg, less than or equal to about 12.1 μg, less than or equal to about 12 μg, less than or equal to about 11.9 μg, or less than or equal to about 11.8 μg, per milligram (mg) of quantum dot. A mole ratio of the halogen (e.g., chlorine) to the organic ligand (e.g., fatty acid such as oleic acid) may be less or equal to than about 2.2:1, for example, less than or equal to about 2:1, less than or equal to about 1.9:1, less than or equal to about 1.8:1, less than or equal to about 1.7:1, or less than or equal to about 1.6:1. The mole ratio of the halogen to the organic ligand may be greater than or equal to about 0.5:1, for example, greater than or equal to about 0.6:1, greater than or equal to about 0.7:1, greater than or equal to about 0.8:1, or greater than or equal to about 0.9:1.

In an embodiment, the quantum dots including a halogen moiety may be obtained by contacting the quantum dots with a halogen (or a halogen-containing alcohol solution) in an organic dispersion, optionally at an elevated temperature. The halogen-containing alcohol solution may be obtained by dissolving a metal halide compound in a C1 to 010 alcohol. In an embodiment, the quantum dots including a halogen moiety may be formed by forming a layer including the aforementioned quantum dots including an organic ligand, and then coating an organic solution of, e.g., including, a halogen-containing compound having a predetermined concentration (e.g., a metal halide of alcohol solution) on the formed layer.

An absorption/emission wavelength of the quantum dots may be controlled by adjusting the compositions, sizes, or a combination thereof of the quantum dots. The maximum luminescent peak wavelength of the quantum dots may have a wavelength region of ultraviolet to infrared wavelengths or more, e.g., greater. For example, the maximum luminescent peak wavelength of the quantum dots may be greater than or equal to about 300 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the quantum dots may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum luminescent peak wavelength of the quantum dots may be in the range of about 500 nm to about 650 nm. The quantum dots may emit green light, and the maximum luminescent peak wavelength may be in the range of about 500 nm to about 560 nm. The quantum dots may emit green light, and the maximum luminescent peak wavelength may be in the range of about 600 nm to about 650 nm. The quantum dots may emit blue light, and the maximum luminescent peak wavelength may be greater than or equal to about 440 nm and less than or equal to about 480 nm.

The quantum dots may have a quantum efficiency (or quantum yield) of greater than or equal to about 10%, for example, greater than or equal to about 30%, greater than or equal to about 50%, greater than or equal to about 60%, greater than or equal to about 70%, greater than or equal to about 90%, or about 100%. The quantum dots may have a relatively narrow spectrum. The quantum dots full width at half maximum (FWHM) of an emission wavelength spectrum of, for example, less than or equal to about 55 nm, for example about 50 nm, less than or equal to about 45 nm, less than or equal to about 40 nm, or less than or equal to about 30 nm.

The quantum dots may have a particle size of greater than or equal to about 1 nm and less than or equal to about 100 nm (e.g., a diameter, or equivalent diameter converted by assuming a spherical shape from an electron microscope image when not spherical).

The quantum dots may have a (average) size of about 1 nm to about 50 nm. The (average) size of the quantum dots may be, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm. The (average) size of the quantum dots may be, for example, less than or equal to about 50 nm, less than or equal to about 40 nm, less than or equal to about 30 nm, less than or equal to about 20 nm, less than or equal to about 15 nm, or less than or equal to about 10 nm. In an embodiment, the average size of the particles (or quantum dots) may be determined using electron microscopy analysis and optionally a commercially available image analysis program (image J). The "average" may refer to mean, mode, or median.

The shape of the quantum dot is not particularly limited. For example, the shape of the quantum dots may include, but is not limited to, a sphere, a polyhedron, a pyramid, a multipod shape, a hexahedron, a cube, a cuboid, a nanotube, a nanorod, a nanowire, a nanosheet, or a combination thereof. A multi-pod shape may have at least two (e.g., at least three or at least four) branch portions and a valley portion therebetween.

The quantum dots may be commercially available or may be appropriately synthesized. The particle size of the quantum dots may be controlled relatively freely during colloid synthesis, and the particle size may also be controlled uniformly, e.g., the particle sizes may be controlled to be uniform.

In an embodiment, the quantum dots may include or may not include a thiol-based (e.g., thio-containing) organic compound or a salt thereof bound to the surface. The thiol-based organic compound or a salt thereof may include, butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutyl mercaptoacetate, thioglycolic acid, 3-mercaptopropionic acid, thiopronine, 2-mercaptopropionic acid, 2-mercaptopropionate, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxy poly(ethylene glycol) thiol (m(PEG)-SH), dialkyldithiocarbamic acid or a metal salt thereof, or a combination thereof.

In an embodiment, the light emitting layer 13 may include a monolayer of quantum dots. In an embodiment, the light emitting layer 13 may include one or more, two or more, three or more, or four or more and 20 or less, 10 or less, 9 or less, 8 or less, 7 or less or 6 or less monolayers of quantum dots. The light emitting layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer 13 may have a thickness of, for example about 10 nm to about 150 nm, for example about 20 nm to about 100 nm, or for example about 30 nm to about 50 nm.

The forming of the light emitting layer 13 including the quantum dots may include obtaining a composition including quantum dots and coating or depositing the composition on a substrate or a charge auxiliary layer by an appropriate method (e.g., by spin coating, inkjet printing, etc.). The forming of the light emitting layer may further include heat-treating the coated or deposited quantum dot layer. The heat treatment temperature is not particularly limited and may be appropriately selected taking to consideration the boiling point of the organic solvent and the like. For example, the heat treatment temperature may be greater than or equal to about 60° C. The type of the organic solvent for the quantum dot dispersion is not particularly limited and may be appropriately selected. In an embodiment, the organic solvent may include an (substituted or unsubstituted) aliphatic hydrocarbon organic solvent, an (substituted or unsubstituted) aromatic hydrocarbon organic solvent, an acetate solvent, or a combination thereof.

The light emitting layer may have a single layer or a multilayer structure in which two or more layers are stacked. Adjacent layers in the multilayer structure (e.g., a first light emitting layer and a second light emitting layer) may be configured to emit a light of substantially the same color. In a multilayer structure, adjacent layers (e.g., a first light emitting layer and a second light emitting layer) may have substantially the same or different compositions, ligands, or a combination thereof from each other. In an embodiment, the light emitting layer or the multilayer light emitting layer including two or more layers may have a halogen content that varies in a thickness direction. In the (multilayer) light emitting layer according to an embodiment, the halogen content may increase towards the electron auxiliary layer. In the (multilayer) light emitting layer according to an embodiment, the organic ligand content may decrease towards the electron auxiliary layer. In the light emitting layer according to an embodiment, the halogen content may decrease toward the electron auxiliary layer. In the (multilayer) light emitting layer according to an embodiment, the organic ligand content may increase towards the electron auxiliary layer.

In an embodiment, the light emitting layer may include a first quantum dot light emitting layer substituted with halogen (e.g., chlorine) on the surface and a second quantum dot light emitting layer disposed thereon and having an increased organic ligand content. A halogen (or chlorine) content and the organic material content of the light emitting layer may be controlled by suitable means (for example, a post treatment for the formed layer). In an embodiment, a thin film of quantum dots having the aforementioned organic ligand (e.g., a carboxylic acid group-containing ligand) is treated with an alcohol solution of, e.g., including, metal halide (e.g., a zinc halide or zinc chloride) to adjust (decrease) the organic ligand content of the quantum dots in the thin film. This treated layer may have an increased amount of halogen and may exhibit an altered dissolution property for an organic solvent. Accordingly, a layer of quantum dots having a different amount of an organic ligand (e.g., a halogen-treated quantum dot(s) or a quantum dot having a carboxylic acid group-containing ligand) may be subsequently formed on the treated light emitting layer.

The light emitting layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The light emitting layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the light emitting layer 13 may have a HOMO energy level of about 5.6 eV to about 6.0 eV. The light emitting layer 13 may have a LUMO energy level of, for example, less than or equal to about 3.8 eV, for example, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The LUMO energy level of the light emitting layer 13 may be greater than or equal to about 2.5 eV. In an embodiment, the light emitting layer 13 may have a bandgap energy of about 2.4 eV to about 2.9 eV.

The light emitting device or the stacked structure according to an embodiment includes an electron auxiliary layer 14 or a layer including metal oxide nanoparticles and a nitrogen-containing metal complex (e.g., (directly) on the light emitting layer). The layer may be configured to transport electrons, for example, into an adjacent light emitting layer, inject electrons, for example, into an adjacent light emitting layer, or a combination thereof. The layer or the electron auxiliary layer, when applied to, e.g., used in, a device, may improve electroluminescent properties, extend a life-span, or a combination thereof of the device.

In a quantum dot-light emitting diode (QD-LED), holes and electrons supplied from two opposing electrodes (e.g., cathode and anode) pass through a charge auxiliary layer (e.g., hole transport layer (HTL), electron transport layer (ETL), or a combination thereof), respectively, and are finally combined in an emissive layer (EML), which is the light emitting layer to emit light. A quantum dot light emitting device emitting light by applying a voltage (hereinafter, also referred to as QD-LED) includes quantum dots as a light emitting material. A QD-LED uses a different emission principle from an organic light emitting diode (OLED) using organic materials and realizes, e.g., displays, more pure colors (red, green, blue) and improved color reproducibility, attracting attention as a next generation display device. Compared with an OLED, a QD-LED may perform a plurality of processes in a solution process and thus lower, e.g., reduce, a manufacturing cost. A QD-LED uses an inorganic material as a light emitting material and thus may realize, e.g., exhibit, improved stability compared with an OLED, but it is still desirable to develop a technology of improving light emitting properties and life-span characteristics of the QD-LED. For example, in order to expand the use of the quantum dot-based light emitting device (QD-LED), it may be desirable to develop a charge auxiliary layer (hereinafter, also referred to as a common layer) capable of facilitating the transport of electrons and holes toward a light emitting layer including a QD or a population of QDs. Without wishing to be bound by any theory, it is understood that the common layer may be a reason that causes, e.g., may contribute to, exciton quenching and charge imbalance in the QD light emitting layer, affecting efficiency and a life-span of a QD-LED.

An electron auxiliary layer (e.g., an electron transport layer (ETL)) of the quantum dot-based QD-LED may include a zinc containing metal oxide. A zinc-containing metal compound may be formed into a zinc oxide-based (e.g., zinc oxide-containing) crystalline film via a sol-gel process (e.g., involving a heat treatment at a high temperature of 200° C. or greater than or equal to about 250° C.), and the resulting product may be used as an electron auxiliary layer. However, the quantum dot, unlike the organic light emitting material, may be susceptible to a process involving a high temperature heat treatment, and accordingly, after the formation of the light emitting layer of the quantum dot, a structure for the QD-LED may not be subjected to a process involving a high temperature heat treatment. Accordingly, a method involving a high temperature heat treatment may be limitedly applied to, e.g., used in, a device having an inverted structure.

Zinc oxide nanoparticles may form the electron auxiliary layer on a quantum dot containing EML at a relatively low temperature through a wet process. However, the present inventors have found that it may be difficult for an electron transport layer (ETL) based on metal oxide nanoparticles to exhibit a desired electron transport characteristic, for example, when it is combined with a light emitting layer including cadmium-free quantum dots. Without being bound by any particular theory, it is understood that some voids among nanoparticles disposed in the electron auxiliary layer may adversely affect an electron transport property.

In an embodiment, the electron auxiliary layer includes a nitrogen-containing metal complex (or nitrogen-containing zinc complex) with a plurality of metal oxide nanoparticles, and in the electron auxiliary layer, a mole ratio of nitrogen to zinc may be greater than or equal to about 0.001:1, greater than or equal to about 0.003:1, greater than or equal to about 0.005:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, or greater than or equal to about 0.65:1. In the electron auxiliary layer, the mole ratio of nitrogen to zinc may be less than or equal to about 1:1, less than or equal to about 0.9:1, less than or equal to about 0.8:1, less than or equal to about 0.7:1, less than or equal to about 0.6:1, or less than or equal to about 0.5:1. A stacked structure according to an embodiment includes a layer including a plurality of metal oxide nanoparticles and the nitrogen-containing zinc complex (hereinafter, the layer also may be referred to as an electron auxiliary layer). The layer may be configured to inject electrons, transport electrons, or a combination thereof.

The electron auxiliary layer according to an embodiment may be formed in a method substantially not involving a high temperature process (in other words, a solution process at a relatively low temperature, which is described herein), and the formed layer (e.g., even though combined with the cadmium-free quantum dot light emitting layer) may contribute to improving properties (e.g., improving a life-span) of a light emitting device. Without being bound by any particular theory, it is understood that the nitrogen-containing metal complex (or the nitrogen-containing zinc complex) may improve electron transport characteristics of a zinc metal oxide nanoparticle-based (e.g., zinc metal oxide nanoparticle-containing) thin film formed in a colloidal method and accordingly, improve overall luminous efficiency of a device and maintain photoluminescence characteristics thereof without deteriorating the device for an extended period.

The metal oxide nanoparticles include zinc. The metal oxide nanoparticles may further include a dopant metal according to selection. The dopant metal may include an alkaline metal, an alkaline-earth metal, a Group IIIB metal, a Group IVB metal, a Group IIIA metal, tungsten, cobalt, or a combination thereof. The alkaline metal may include lithium, sodium, potassium, rubidium, cesium, or a combination thereof. The alkaline-earth metal may include magnesium, calcium, strontium, barium, or a combination thereof. The Group IIIB metal may include scandium, yttrium, or a combination thereof. The Group IVB metal may include titanium, zirconium, hafnium, or a combination thereof. The Group IIIA metal may include aluminum, gallium, indium, thallium, or a combination thereof. In an embodiment, the dopant may include magnesium. The metal oxide nanoparticles may be crystalline. The metal oxide nanoparticles may be amorphous.

In the metal oxide (or the electron auxiliary layer), a mole ratio of the dopant metal (e.g., magnesium, aluminum, lithium, or a combination thereof) to zinc may be greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, or greater than or equal to about 0.49:1.

In the metal oxide (or the electron auxiliary layer), a mole ratio of the dopant metal (e.g., magnesium, aluminum, lithium, or a combination thereof) to zinc may be less than or equal to about 0.5:1, less than or equal to about 0.49:1, less than or equal to about 0.48:1, less than or equal to about 0.47:1, less than or equal to about 0.46:1, less than or equal to about 0.45:1, less than or equal to about 0.44:1, less than or equal to about 0.43:1, less than or equal to about 0.42:1, less than or equal to about 0.41:1, less than or equal to about 0.4:1, less than or equal to about 0.39:1, less than or equal to about 0.38:1, less than or equal to about 0.37:1, less than or equal to about 0.36:1, less than or equal to about 0.35:1, less than or equal to about 0.34:1, less than or equal to about 0.33:1, less than or equal to about 0.32:1, less than or equal to about 0.31:1, less than or equal to about 0.3:1, less than or equal to about 0.29:1, less than or equal to about 0.28:1, less than or equal to about 0.27:1, less than or equal to about 0.26:1, less than or equal to about 0.25:1, less than or equal to about 0.24:1, less than or equal to about 0.23:1, less than or equal to about 0.22:1, less than or equal to about 0.21:1, or less than or equal to about 0.2:1.

The metal oxide nanoparticles may include a compound represented by Chemical Formula 1:

$$Zn_{1-x}M_xO$$

wherein, M is the aforementioned dopant metal, for example, Mg, Ca, Zr, Co, W, Li, Ti, Y, Al, or a combination thereof, and $0 \le x \le 0.5$.

In the device, an absolute value of a difference between a conduction band edge energy level of the electron auxiliary layer and a work function of the second electrode may be less than or equal to about 0.4 eV, less than or equal to about 0.3 eV, less than or equal to about 0.2 eV, or less than or equal to about 0.1 eV. The absolute value of the difference between the conduction band edge energy level of the electron auxiliary layer and the LUMO energy level of the light emitting layer may be less than or equal to about 0.4 eV, less than or equal to about 0.3 eV, less than or equal to about 0.2 eV, or less than or equal to about 0.1 eV.

In an embodiment, the metal oxide nanoparticles may not exhibit light emission (e.g., a band edge emission) at a predetermined wavelength (e.g., a wavelength in the visible light range). The metal oxide nanoparticles may be non-luminescent in a predetermined wavelength range. The predetermined wavelength may be in the range of about 440 nm to about 700 nm, for example about 460 nm to about 650 nm, about 480 nm to about 640 nm, or about 500 nm to about 620 nm.

The electron auxiliary layer may have a first UV absorption peak wavelength of less than or equal to about 350 nm, less than or equal to about 345 nm, or less than or equal to about 340 nm. The electron auxiliary layer may have a first UV absorption peak wavelength of greater than or equal to about 290 nm, greater than or equal to about 300 nm, greater than or equal to about 310 nm, greater than or equal to about 320 nm, greater than or equal to about 325 nm, or greater than or equal to about 330 nm.

In an embodiment, the nitrogen-containing metal complex (or zinc complex) may include a, e.g., at least one, of the aforementioned dopant metals. In an embodiment, the nitrogen-containing metal complex (or zinc complex) may further include magnesium, lithium, aluminum, gallium, cobalt, yttrium, nickel, or a combination thereof.

In the electron auxiliary layer, a mole content of nitrogen per 1 mole of zinc may be greater than or equal to about 0.001, greater than or equal to about 0.005, greater than or equal to about 0.009, greater than or equal to about 0.01, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, greater than or equal to about 0.1, greater than or equal to about 0.15, greater than or equal to about 0.2, greater than or equal to about 0.25, greater than or equal to about 0.3, greater than or equal to about 0.35, greater than or equal to about 0.4, greater than or equal to about 0.45, greater than or equal to about 0.5, greater than or equal to about 0.55, greater than or equal to about 0.6, or greater than or equal to about 0.65. In the electron auxiliary layer, the mole content of nitrogen per 1 mole of zinc may be less than or equal to about 1.5, less than or equal to about 1.3, less than or equal to about 1, less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, less than or equal to about 0.1, less than or equal to about 0.09, less than or equal to about 0.05, or less than or equal to about 0.04.

In the electron auxiliary layer, a mole content of carbon per 1 mole of zinc may be greater than or equal to about 0.01, greater than or equal to about 0.015, greater than or equal to about 0.03, greater than or equal to about 0.045, greater than or equal to about 0.06, greater than or equal to about 0.075, greater than or equal to about 0.09, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, greater than or equal to about 0.9, greater than or equal to about 1, greater than or equal to about 1.1, greater than or equal to about 1.2, greater than or equal to about 1.3, greater than or equal to about 1.4, greater than or equal to about 1.5, greater than or equal to about 1.6, greater than or equal to about 1.7, greater than or equal to about 1.8, greater than or equal to about 1.9, greater than or equal to about 2, greater than or equal to about 3, or greater than or equal to about 3.2. In the electron auxiliary layer, the mole content of carbon per 1 mole of zinc may be less than or equal to about 6, less than or equal to about 5.5, less than or equal to about 5, less than or equal to about 4.5, less than or equal to about 4, less than or equal to about 3.5, less than or equal to about 3, less than or equal to about 2, less than or equal to about 1.9, less than or equal to about 1.8, less than or equal to about 1.7, less than or equal to about 1.6, less than or equal to about 1.5, less than or equal to about 1.4, less than or equal to about 1.3, less than or equal to about 1.2, or less than or equal to about 1.1.

The electron auxiliary layer may include an oxygen-containing polar ligand having 6 or less carbon atoms (e.g., C1 to C6, C2 to C5, C3 to C4, or a combination thereof). The oxygen-containing polar ligand may include a carboxylate group, a carbonyl group, an ester group, a hydroxyl group, an alkoxy group, or a combination thereof. The oxygen-containing polar ligand may include an acetate group, an acetylacetonate group, a hydroxide group, an alkoxide group, a formate moiety, or a combination thereof.

The electron auxiliary layer may include a nitrogen-containing polar ligand having 6 or less carbon atoms (e.g., C1 to C6, C2 to C5, C3 to C4, or a combination thereof). The nitrogen-containing polar ligand may include an alkylamine moiety, a hydroxy alkylamine moiety, or a combination thereof. The nitrogen-containing polar ligand may include one or more (e.g., at least two or at least three) functional groups (e.g., a hydroxyl group, an amine group, an ammonium group, or a combination thereof). The nitrogen-containing polar ligand may include C1 to C6 hydroxyalkyl amine such as methanolamine, monoethanolamine, propanolamine, butanolamine, pentanolamine, etc., a diamine compound (e.g., having an amine group at both terminal ends thereof) such as ethylenediamine, propylenediamine, butylenediamine, pentylenediamine, etc., a tetraalkylammonium group such as a tetramethylammonium group, a tetraethylammonium group, or a combination thereof.

In the electron auxiliary layer (or the layer of the stacked structure), the nitrogen-containing zinc complex (or nitrogen-containing metal complex) is added together with the metal oxide nanoparticles and thus is soluble in a polar organic solvent (e.g., alcohol) (that is, has solubility in a polar organic solvent) and the nitrogen-containing zinc complex may be insoluble in a non-polar organic solvent (e.g., an alkane solvent such as hexane or heptane, an aromatic hydrocarbon solvent such as benzene or toluene, or a combination thereof). As used herein, "insoluble" means inability to form a transparent solution with the naked eye.

The nitrogen-containing zinc complex may be represented by Chemical Formula 2:

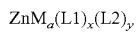  Chemical Formula 2

M is the aforementioned dopant metal, or for example, Mg, Ca, Zr, Co, W, Li, Ti, Y, Al, or a combination thereof, L1 represents a C6 or less oxygen-containing organic ligand, L2 represents a C6 or less nitrogen-containing organic ligand, "a" "x" and "y" represents a number of moles of M, L1, and L2, relative to zinc (e.g., per one mole of zinc), respectively, and "a" may be a number greater than or equal to 0 and less than or equal to 1, for example, a is greater than 0, greater than or equal to about 0.001, greater than or equal to about 0.005, greater than or equal to about 0.01, greater than or equal to about 0.05, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9, and less than or equal to about 1, and less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1, x is a number of greater than or equal to about 0, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9 and less than or equal to about 1.5, less than or equal to about 1.176, less than or equal to about 1, less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1, and y is a number of greater than or equal to about 0, greater than or equal to about 0.1, greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, or greater than or equal to about 0.9 and less than or equal to about 1.5, less than or equal to about 1.176, less than or equal to about 1, less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, or less than or equal to about 0.1, provided that the x and the y are not 0 (zero) simultaneously (at the same time).

L1 and L2 may optionally be linked to each other.

The L1 may include an acetate group, an alkoxide group, a hydroxy group, an alkoxide group, a formate group, an acetylacetonate group, or a combination thereof. The L2 may include an alkylamine moiety, an ammonium salt moiety, or a combination thereof. L1 may include the aforementioned oxygen-containing polar ligand and L2 may include the aforementioned nitrogen-containing polar ligand.

The metal oxide nanoparticles included in the electron auxiliary layer of the light emitting device according to an embodiment may have an organic material content of greater than or equal to about 20 wt %, greater than or equal to about 24 wt %, or greater than or equal to about 25 wt %, as determined by thermogravimetric analysis. The metal oxide nanoparticles may have an organic material content of less than or equal to about 40 wt %, less than or equal to about 35 wt %, or less than or equal to about 30 wt %, as determined by thermogravimetric analysis.

In the layer, a content of the nitrogen-containing zinc complex may be less than or equal to about 50 wt %, less than or equal to about 45 wt %, less than or equal to about 40 wt %, less than or equal to about 35 wt %, or less than or equal to about 30 wt %, based on the total weight of the layer.

In an embodiment, the light emitting device (or the stacked structure) may be produced by a method that includes dissolving a first zinc precursor and optionally a further metal precursor (e.g., a precursor including the aforementioned dopant or magnesium, lithium, aluminum, gallium, cobalt, yttrium, nickel, or a combination thereof) in an organic solvent in the presence of a nitrogen-containing multi-functional organic compound and stirring the resultant at a predetermined temperature (e.g., greater than or equal to about 20° C., greater than or equal to about 25° C., greater than or equal to about 30° C., greater than or equal to about 35° C., greater than or equal to about 40° C., greater than or equal to about 45° C., or greater than or equal to about 50° C.) to form a nitrogen-containing metal complex;

dispersing the nitrogen-containing metal complex and the metal oxide nanoparticles in a polar solvent to obtain a mixed coating liquid; and coating the obtained mixed coating liquid (e.g., on the light emitting layer) and removing the polar solvent.

The temperature for forming the nitrogen-containing metal complex may be less than or equal to about 100° C., less than or equal to about 90° C., less than or equal to about 80° C., less than or equal to about 70° C., less than or equal to about 65° C., or less than or equal to about 60° C. The stirring may be performed for an appropriate time. In an embodiment, the stirring may be performed for greater than or equal to about 1 hour, greater than or equal to about 2 hours, or greater than or equal to about 3 hours. The stirring may be performed for less than or equal to about 24 hours, or less than or equal to about 20 hours. The stirring may be performed for a predetermined time, for example, for greater than or equal to about 1 hour at an elevated temperature, and then again at a lower temperature for a predetermined time.

The first zinc precursor may include a C6 or less carboxylate moiety (e.g., RCOO, wherein R is a 01 to C5 alkyl group, an alkenyl group, or an alkynyl group), or a combination thereof. The additional metal precursor may include a C6 or less carboxylate moiety (e.g., RCOO, wherein R is a 01 to C5 alkyl group, an alkenyl group, or an alkynyl group), or a combination thereof. The additional metal precursor may include the aforementioned dopant metal. The additional metal precursor may include magnesium, lithium, aluminum, gallium, cobalt, yttrium, nickel, or a combination thereof.

The nitrogen-containing multi-functional organic compound may include a compound having 6 or less carbon atoms and including an amine group and a hydroxyl group. The organic solvent may include a C1 to C10 alcohol, a C2 to C20 alkoxyalcohol such as methoxy ethanol or ethoxy ethanol, a C1 to C100 alkylene glycol, or a combination thereof.

The formed metal complex may be separated by removing the organic solvent. The formed metal complex may be dissolved in a polar solvent (e.g., a C1 to C10 alcohol such as methanol or ethanol) as described herein.

The nitrogen-containing metal complex may be dispersed in a polar solvent together with the metal oxide nanoparticles to provide a mixed coating liquid.

The metal oxide nanoparticles may be prepared by a sol-gel method, a colloidal method, or any suitable method. In an embodiment, the metal oxide nanoparticles may be prepared by dissolving a second zinc precursor and optionally a dopant metal precursor in an organic solvent (e.g., a polar solvent such as dimethyl sulfoxide), adding a solution including (e.g., a stoichiometry amount of) a suitable base (e.g., hydroxide compound) to a solution obtained at a predetermined temperature (e.g., room temperature, or greater than or equal to about 30° C., or greater than or equal to about 40° C. and less than or equal to about 60° C., or less than or equal to about 50° C.) to obtain a precipitation of metal oxides, and washing the obtained precipitate several times with a washing solvent. The washing solvent and the organic solvent may include a C1 to C10 alcohol solvent such as ethanol, methanol, propanol, a C1 to C10 ester solvent such as alkyl acetate, a C1 to C20 amine solvent, a C1 to C20 amide solvent such as dimethyl formamide (DMF), a C1 to C20 sulfoxide such as dimethyl sulfoxide (DMSO), or a combination thereof.

The types of the second zinc precursor and the dopant precursor may be any suitable compound and is not particularly limited. The precursor may include a C1 to C30 metal carboxylate (e.g., acetate) or a hydrate thereof.

The base solution may include a hydroxide compound. The hydroxy compound may include an alkali metal hydroxide (e.g., sodium hydroxide, potassium hydroxide, etc.), an alkaline-earth metal hydroxide, an alkylammonium hydroxide (e.g., trimethylammonium hydroxide), or a combination thereof.

The polar solvent may include a C1 to C10 alcohol solvent such as ethanol, a C2 to C20 sulfoxide solvent such as dimethylsulfoxide, a C2 to C20 amide solvent such as dimethylformamide, or a combination thereof, but is not limited thereto.

In the mixed coating liquid, a ratio between the complex compound and the metal oxide nanoparticles may be adjusted to obtain a desired composition. In an embodiment, the nitrogen-containing metal complex compound may be (optionally dissolved in an amine solvent such as an alcohol amine and) diluted in a desired solvent (e.g., an organic solvent such as ethanol) and a desired amount of metal oxide nanoparticles may be added thereto to prepare a coating liquid. A volume ratio of the nitrogen-containing metal complex (solution) to ethanol for dilution may be about 1:0.1 to about 1:100, about 1:1 to about 1:20, about 1:2 to about 1:10, or a combination thereof. In the coating liquid, a concentration of the nanoparticles may be in the range of about 0.01 wt % to about 50 wt %, about 0.1 wt % to about 30 wt %, about 0.5 wt % to about 15 wt %, about 0.7 wt % to about 10 wt %, about 1 wt % to about 8 wt %, about 3 wt % to about 5 wt %, or a combination thereof.

The obtained mixed coating liquid is coated (e.g., on the light emitting layer or on the cathode to be described herein) and the polar solvent is removed to form an electron auxiliary layer. The formed layer may be subjected to drying, annealing, or a combination thereof.

The drying, annealing, or combination thereof may be performed at a predetermined temperature (e.g., a temperature of greater than or equal to about 60° C., or greater than or equal to about 70° C. and less than or equal to about 200° C., less than or equal to about 190° C., less than or equal to about 180° C., less than or equal to about 170° C., less than or equal to about 100° C., less than or equal to about 95° C., less than or equal to about 90° C., less than or equal to about 80° C., or less than or equal to about 75° C.), for example, under vacuum, but the present disclosure is not limited thereto.

The thickness of the layer in the electron auxiliary layer or the stacked structure may be appropriately selected taking into consideration the emission wavelength of quantum dots, the thickness of the light emitting layer, and the like. The thickness of the electron auxiliary layer may be greater than or equal to about 10 nm, greater than or equal to about 11 nm, greater than or equal to about 12 nm, greater than or equal to about 15 nm, greater than or equal to about 20 nm, or greater than or equal to about 25 nm and less than or equal to about 100 nm, less than or equal to about 90 nm, less than or equal to about 80 nm, less than or equal to about 70 nm, less than or equal to about 60 nm, or less than or equal to about 50 nm.

The light emitting device may further include a first electrode 11 and a second electrode 15 facing each other, and the light emitting layer may be disposed between the first electrode 11 and the second electrode 15. One of the first electrode 11 and the second electrode 15 is an anode and the other is a cathode. Hereinafter, a case in which the first electrode is an anode will be described as an example, but the present disclosure is not limited thereto.

In the stacked structure, the layer includes a first surface and a second surface opposite to the first surface, and an electrode (e.g., a cathode) capable of injecting electrons may be disposed on the first surface, and a light emitting layer including a plurality of quantum dots may be disposed on the second surface. The descriptions of the light emitting layer are the same as described herein.

A hole auxiliary layer 12 may be disposed between the first electrode 11 (or an anode) and the light emitting layer 13. The electron auxiliary layer may be disposed between the second electrode (e.g., a cathode) 15 and the light emitting layer 13.

The light emitting device (or stacked structure) may further include a substrate. The substrate may be disposed on the first electrode 11 side or the second electrode 15 side. In an embodiment, the substrate may be disposed on the first electrode side (e.g., under the first electrode). The substrate may be a substrate including an insulating material (e.g., an insulating transparent substrate). The substrate may include glass; various polymers such as polyesters (e.g., polyethylene terephthalate (PET), polyethylene naphthalate (PEN)), polycarbonate, poly(meth)acrylate, polyimide, polyamideimide, and the like; polysiloxane (e.g., polydimethylsiloxane (PDMS)); inorganic materials such as glass, silicon, silicon oxide, $Al_2O_3$, and the like; or a combination thereof, but is not limited thereto. Herein "transparent" refers to transmittance of light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material but is not particularly limited. The transparent substrate may have flexibility. The substrate may be omitted.

The first electrode 11 may be made of a conductor, for example a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto. In an embodiment, the first electrode may include a transparent conductive metal oxide, for example, indium tin oxide. A work function of the first electrode may be higher, e.g., greater, than a work function of the second electrode, which will be described herein. The work function of the first electrode may be lower, e.g., less, than the work function of the second electrode, which will be described herein.

The second electrode 15 may be made of a conductor, for example a metal, a conductive metal oxide, a conductive polymer, or a combination thereof. The second electrode 15 may be for example a metal such as aluminum, magnesium, calcium, sodium, potassium, titanium, indium, yttrium, lithium, gadolinium, silver, tin, lead, cesium, or barium, or an alloy thereof; a multilayer structured material such as LiF/Al, $Li_2O$/Al, 8-hydroxyquinolinolato-lithium (Liq)/Al, LiF/Ca, or $BaF_2$/Ca, or a combination thereof, but is not limited thereto. In an embodiment, the second electrode may include a transparent conductive metal oxide, for example, indium tin oxide. The conductive metal oxide is the same as described herein.

In an embodiment, the work function of the first electrode (e.g., anode) may be greater than or equal to about 4.0 eV, greater than or equal to about 4.1 eV, greater than or equal to about 4.2 eV, greater than or equal to about 4.3 eV, greater than or equal to about 4.4 eV, greater than or equal to about 4.5 eV, greater than or equal to about 4.6 eV, greater than or equal to about 4.7 eV, or greater than or equal to about 4.8 eV and less than or equal to about 5.5 eV, less than or equal to about 5.4 eV, less than or equal to about 5.3 eV, less than or equal to about 5.2 eV, less than or equal to about 5.1 eV, less than or equal to about 5.0 eV, or less than or equal to about 4.9 eV.

The work function of the second electrode (e.g., cathode) may be greater than or equal to about 3.4 eV, for example greater than or equal to about 3.5 eV, greater than or equal to about 3.6 eV, greater than or equal to about 3.7 eV, greater than or equal to about 3.8 eV, greater than or equal to about 3.9 eV, greater than or equal to about 4.0 eV, greater than or equal to about 4.1 eV, greater than or equal to about 4.2 eV, greater than or equal to about 4.3 eV, greater than or equal to about 4.4 eV, or greater than or equal to about 4.5 eV and less than or equal to about 5.0 eV, less than or equal to about 4.9 eV, less than or equal to about 4.8 eV, less than or equal to about 4.7 eV, less than or equal to about 4.6 eV, less than or equal to about 4.5 eV, or less than or equal to about 4.4 eV.

The first electrode 11, the second electrode 15, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, it may be made of for example an opaque conductor such as aluminum (Al), silver (Ag), or gold (Au).

A thickness of the electrodes (the first electrode, the second electrode, or each of the first electrode and the second electrode) is not particularly limited and may be appropriately selected considering device efficiency. For example, the thickness of the electrodes may be greater than or equal to about 5 nm, for example, greater than or equal to about 50 nm, or greater than or equal to about 100 nm. For example, the thickness of the electrodes may be less than or equal to about 100 micrometers (μm), for example, less than or equal to about 10 μm, or less than or equal to about 1 μm, less than or equal to about 900 nm, less than or equal to about 500 nm, less than or equal to about 400 nm, less than or equal to about 300 nm, less than or equal to about 200 nm, or less than or equal to about 100 nm.

The hole auxiliary layer 12 is disposed between the first electrode 11 and the light emitting layer 13. The hole auxiliary layer 12 may have one or more layers, and may include, for example, a hole injection layer 12a, a hole transport layer 12b, an electron blocking layer (not shown), or a combination thereof.

The HOMO energy level of the hole auxiliary layer 12 may be matched with the HOMO energy level of the light emitting layer 13, so that the mobility of holes transferred from the hole auxiliary layer 12 to the light emitting layer 13 may be enhanced.

The HOMO energy level of the hole auxiliary layer 12 (e.g., the hole transport layer) adjacent to the light emitting layer may be appropriately adjusted taking to consideration the HOMO energy level of the light emitting layer 13. In an embodiment, the hole auxiliary layer 12 may include a hole injection layer close to the first electrode 11 and a hole transport layer close to the light emitting layer 13.

The material included in the hole auxiliary layer 12 is not particularly limited. In an embodiment, the hole auxiliary layer may exhibit relatively high hole conductivity. The material of the hole auxiliary layer may include an organic monomolecular compound, a high molecular compound, or a combination thereof. A material included in the hole auxiliary layer 12 is not particularly limited and may include for example poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., $NiO$, $WO_3$, $MoO_3$, etc.), a carbon-based (e.g., carbon-containing) material such as graphene oxide, or a combination thereof, but is not limited thereto.

For example, a thickness of the hole auxiliary layer (e.g., hole transport layer, hole injection layer, or a combination thereof) may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto.

The hole injection layer, the hole transport layer, or a combination thereof may be formed by a solution process (e.g., spin coating, etc.). The hole injection layer, the hole transport layer, or a combination thereof may be formed by a deposition process.

Figure 1B:
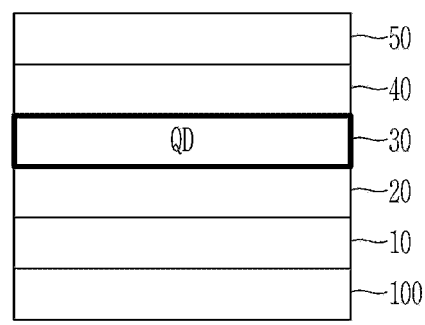
FIG. 1B is a cross-sectional view schematically illustrating a light emitting device according to an embodiment.
Figure 1C:
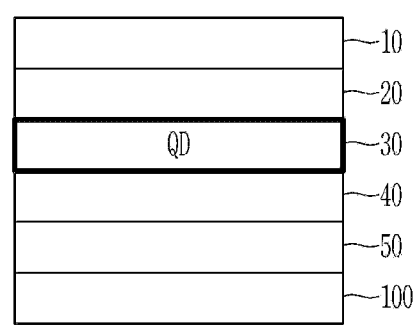
FIG. 1C is a cross-sectional view schematically illustrating a light emitting device according to an embodiment.

A device according to an embodiment may have a normal structure. In an embodiment, in the device, an anode 10 disposed on a transparent substrate 100 may include a metal oxide-based (e.g., metal oxide-containing) transparent electrode (e.g., ITO electrode) and a cathode 50 facing the anode 10 may include a conductive metal (e.g., Mg, Al, Ag, or a combination thereof) (e.g., having a relatively low work function). A hole auxiliary layer 20 (e.g., a hole injection layer of PEDOT:PSS, a p-type metal oxide, or a combination thereof; a hole transport layer of TFB, polyvinylcarbazole (PVK), or a combination thereof; or a combination thereof) may be disposed between the transparent electrode 10 and the quantum dot light emitting layer 30. The hole injection layer may be near to the transparent electrode and the hole transport layer may be near to the light emitting layer. An electron auxiliary layer 40 such as an electron injection layer/a transport layer may be disposed between the quantum dot light emitting layer 30 and the cathode 50. (see FIG. 1B)

A device according to an embodiment may have an inverted structure. A cathode 50 disposed on the transparent substrate 100 may include a metal oxide-based transparent electrode (e.g., ITO) and a second electrode (e.g., an anode) 10A facing the cathode may include a metal (e.g., Au, Ag, Al, Mg, or a combination thereof) (e.g., having a relatively high work function). For example, an (optionally doped) n-type metal oxide (crystalline Zn metal oxide) may be disposed between the transparent electrode 50 and the emitting layer 30 as an electron auxiliary layer (e.g., an electron transport layer) 40. $MoO_3$ or another p-type metal oxide may be disposed between the second electrode (e.g., metal anode) 10A and the quantum dot light emitting layer 30 as a hole auxiliary layer 20 (e.g., a hole transport layer including TFB, PVK, or a combination thereof; a hole injection layer including $MoO_3$ or another p-type metal oxide; or a combination thereof). (see FIG. 1B)

A method of forming the first electrode (anode), the hole auxiliary layer, and the second electrode (cathode) may be appropriately selected taking to consideration the type of material, the thickness of the electrode/layer to be produced, and the like. The formation methods thereof may include solution processes, (physical/chemical) vapor deposition, or a combination thereof. In an embodiment, the aforementioned hole auxiliary layer 12, quantum dot-containing light emitting layer 13, and electron auxiliary layer 14 may be formed, for example, by a solution process. The solution processes may include, but are not limited to, spin coating, slit coating, inkjet printing, nozzle printing, spraying, doctor blade coating, or a combination thereof.

The aforementioned light emitting device may exhibit improved physical properties and life-span characteristics. The light emitting device may emit light having a predetermined wavelength range. For example, the light emitting device may emit red light, green light, or blue light. The light emitting device may exhibit a maximum emission peak in a wavelength range of greater than or equal to about 600 nm and less than or equal to about 650 nm. The light emitting device may exhibit a maximum emission peak in a wavelength range of greater than or equal to about 500 nm and less than or equal to about 560 nm. The light emitting device may exhibit a maximum emission peak in a wavelength range of greater than or equal to about 440 nm and less than or equal to about 480 nm.

The light emitting device may exhibit a maximum external quantum efficiency of greater than or equal to about 10%, greater than or equal to about 11%, or greater than or equal to about 12%. The light emitting device may exhibit a maximum luminance of greater than or equal to about 35,000 $cd/m^2$, for example, greater than or equal to about 36,000 $cd/m^2$, or greater than or equal to about 37,000 $cd/m^2$.

The light emitting device may exhibit a T90 of greater than or equal to about 50 hours, for example, greater than or equal to about 55 hours, greater than or equal to about 60 hours, or greater than or equal to about 65 hours. The light emitting device may exhibit a T90 of greater than or equal to about 10 hours, for example, greater than or equal to about 15 hours, or greater than or equal to about 20 hours.

The aforementioned light emitting device may be applied to, e.g., used in, various electronic devices such as, for example, a display device or a lighting device.

Hereinafter, the embodiments are illustrated in more detail with reference to examples. However, these examples are exemplary, and the scope of claims is not limited thereto.

Analysis Methods

1. Photoluminescence Analysis

A Hitachi F-7000 spectrophotometer is used to obtain a photoluminescence (PL) spectrum of nanocrystals prepared at an irradiation wavelength of 372 nanometers (nm).

2. Ultraviolet (UV) Spectroscopy

A Hitachi U-3310 spectrophotometer is used to perform UV spectroscopy and obtain an UV-Visible absorption spectrum.

3. Electroluminescence Spectroscopy

Electroluminescent properties are evaluated by using a Keithley 2200 source measuring instrument and a Minolta CS2000 spectroradiometer (a current-voltage-luminance measuring equipment). A current, luminance, and electroluminescence (EL) depending on a voltage applied to a device are measured by using the current-voltage-luminance measuring equipment and then, used to calculate external quantum efficiency.

4. Life-Span Characteristics

T50h: Time (hr) that it takes for 100% of initial luminance to be reduced to 50%, when driven at 100 nit (cd/m$^2$).

T90h: Time (hr) that it takes for 100% of initial luminance to be reduced to 90%, when driven at 100 nit.

Reference Example 1-1: Preparation of Quantum Dots (1) Selenium (Se) and tellurium (Te) are respectively dispersed in trioctyl phosphine (TOP) to prepare an Se/TOP stock solution and a Te/TOP stock solution. On the other hand, 0.125 millimoles (mmol) of zinc acetate with oleic acid are put in a reactor containing trioctylamine and then, heated at 120° C. under vacuum. After 1 hour, an atmosphere in the reactor is substituted with nitrogen.

After heating the reactor at 300° C., the Se/TOP stock solution and the Te/TOP stock solution in a Te:Se ratio of 1:25 are rapidly injected thereinto. When a reaction is completed, acetone is added to the reaction solution rapidly cooled down to room temperature and then, centrifuged, and precipitates obtained therefrom are dispersed in toluene to obtain ZnTeSe quantum dots.

(2) An amount of 1.8 mmol (0.336 grams (g)) of zinc acetate with oleic acid is put in a flask containing trioctylamine and then, vacuum-treated at 120° C. for 10 minutes. The flask is internally substituted with nitrogen (N$_2$) and heated up to 180° C. Subsequently, the ZnTeSe core of Synthesis Example 1 is added thereto, and Se/TOP and S/TOP are injected thereinto. A reaction temperature of the mixture is set at 280° C. or so. When the reaction is all completed, the reactor is cooled down, the prepared nanocrystals are centrifuged with ethanol and then, dispersed in toluene, obtaining ZnTeSe/ZnSeS core-shell quantum dots.

A photoluminescence analysis result exhibits that the obtained core-shell quantum dots emit blue light.

Reference Example 1-2: Halogen Treatment of Quantum Dots

Quantum dots are prepared according to the same method as Reference Example 1 and then, dispersed in toluene, obtaining quantum dot organic dispersion. On the other hand, zinc chloride is dissolved in ethanol, obtaining a zinc chloride solution at a concentration of 10 weight percent (wt %). The quantum dot organic dispersion is added to 0.01 milliliters (mL) of the zinc chloride solution and then, stirred at 60° C. for 30 minutes to perform a surface exchange reaction. After the reaction, ethanol is added thereto to induce precipitation, and precipitates therein are centrifuged to recover quantum dots.

Reference Example 2: ZnMgO Nanoparticle Synthesis

Zinc acetate dihydrate and magnesium acetate tetrahydrate are put in a reactor containing dimethylsulfoxide. Subsequently, an ethanol solution of tetramethylammonium hydroxide pentahydrate is added to the reactor. After 1 hour's stirring, precipitates ($Zn_xMg_{1-x}O$ nanoparticles) formed therein are centrifuged and dispersed in ethanol, obtaining $Zn_{1-x}Mg_xO$ nano particles. (x=0.15)

A transmission electron microscope analysis of the nanoparticles is performed. As a result, the particles have an average size of about 3 nm.

Preparation Example 1: Nitrogen-Containing Zinc Complex

An amount of 4.25 mmol of zinc acetate dihydrate, 0.75 mmol of magnesium acetate tetrahydrate, and 5 mmol of monoethanolamine (MEA) are dissolved in 10 mL of 2-methoxyethanol under a nitrogen atmosphere. The obtained solution is heated up to 60° C. and stirred for 3 hours and then, reacted at room temperature for 13 hours.

The solvent is removed from the reaction solution to obtain a nitrogen-containing zinc complex in a liquid state and then, dissolved again in 1 mL of MEA.

Preparation Example 2: Preparation of Mixed Thin Film

The MEA solution of the nitrogen-containing zinc complex obtained in Preparation Example 1 is diluted by 1/10 with ethanol.

The nanoparticles are dispersed in the diluted solution to prepare a coating liquid having 1 wt % of the nanoparticles. The coating liquid is spin-coated on a glass substrate to form a 20 nm-thick thin film.

Preparation Example 3: Preparation of Mixed Thin Film

A thin film is obtained according to the same method as Preparation Example 2 except that the mixing (dilution) ratio is 4:1 (or 1/5).

Experimental Example 1: Evaluation of Optical Properties

1. An ultraviolet-visible (UV-Vis) absorption spectroscopy analysis is carried out for each of an ethanol dispersion of the nanoparticles according to Reference Example 2, an MEA solution of the nitrogen-containing zinc complex according to Preparation Example 1, and the coating liquid according to Preparation Example 2, and the results are shown in FIG. 2.

Figure 2:
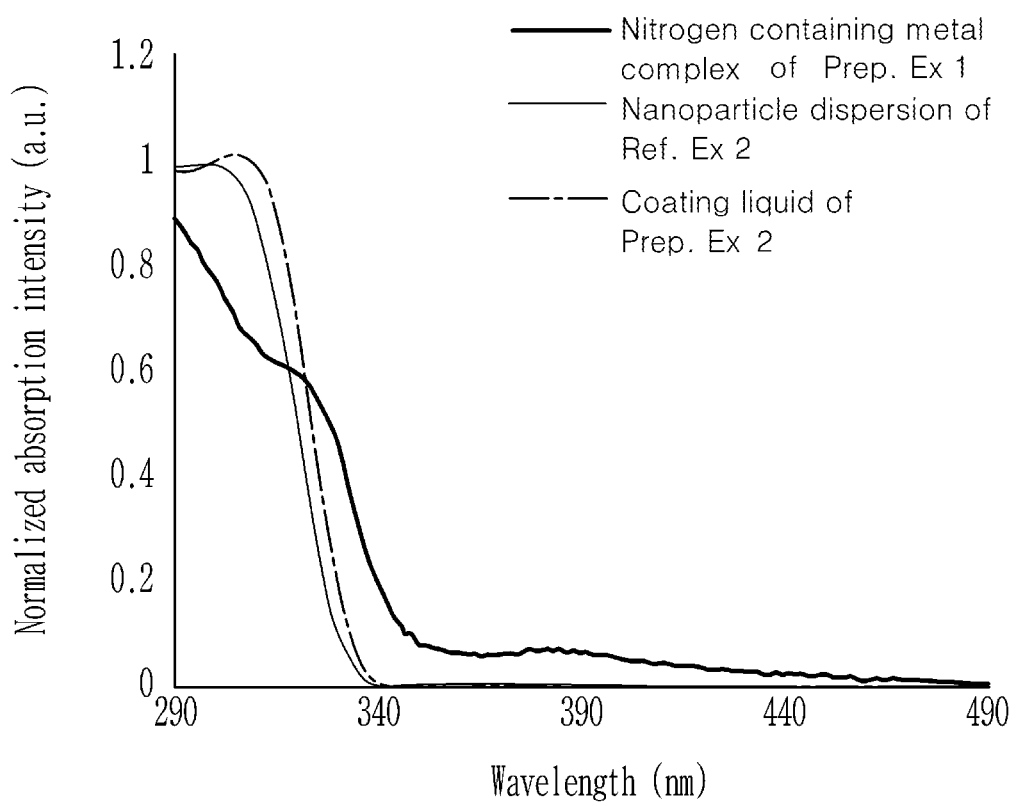
FIG. 2 is a graph of normalized absorption intensity (arbitrary units (a.u.)) versus wavelength (nm) showing ultraviolet-visible (UV-Vis) absorption spectra of the dispersion of the metal complex and nanoparticles used in Preparation Example 2, the metal complex solution of Preparation Example 1, and the dispersion of nanoparticles used in Reference Example 2.

From FIG. 2 showing the results of a UV-vis absorption spectroscopy analysis for a dispersion of the ZnMgO nanoparticles (Reference Example 2), a metal complex solution, and a coating liquid of the ZnMgO nanoparticles and the metal complex (Preparation Example 2), respectively, it is confirmed that the metal complex compound of Preparation Example 1 exhibits a different spectrum from the ZnMgO nanoparticles dispersion of Reference Example 2 and the coating liquid of Preparation Example 2. In addition, as the metal compound exhibits an absorption spectrum unlike precursors having no absorption characteristics such as zinc acetate, magnesium acetate, and the MEA, it is believed that the metal complex has a different structure from these precursors.

2. A UV absorption spectroscopy analysis is performed with respect to thin films formed by spin-coating the ethanol solution of the ZnMgO nanoparticles (Reference Example 2)

and a solution prepared by diluting the nitrogen-containing zinc complex in ethanol to be 20 nm thick and heat-treating them at 80° C. for 30 minutes.

As a result, the nitrogen-containing zinc complex does not form a metal oxide or a nano particle thereof under the conditions of manufacturing a device.

Example 1

1. A device is manufactured in the following method.

After surface-treating a glass substrate deposited with indium tin oxide (ITO) with UV-ozone for 15 minutes, a poly(3,4-ethylenedioxythiophene) polystyrene sulfonate (PEDOT:PSS) solution (H.C. Starks, Inc.) is spin-coated thereon and heat-treated at 150° C. for 10 minutes under an air atmosphere and then, at 150° C. for 20 to 30 minutes under an $N_2$ atmosphere to form a 30 nm-thick hole injection layer. Subsequently, on the hole injection layer, a poly[(9, 9-dioctylfluorenyl-2,7-diyl-co(4,4'-(N-4-butylphenyl)diphenylamine] solution (TFB) (Sumitomo Corp.) is spin-coated and heat-treated at 150° C. for 30 minutes to form a 25 nm-thick hole transport layer.

On the hole transport layer, the quantum dot solution according to Reference Example 1 is spin-coated, spin-treated with a zinc chloride ethanol solution, and then heat-treated at 80° C. for 30 minutes. Then, the quantum dot solution according to Reference Example 2 is spin-coated again to form a 20 nm-thick light emitting layer.

Subsequently, the coating liquid according to Preparation Example 2 is spin-coated on the light emitting layer and heat-treated at 80° C. for 30 minutes to form an electron auxiliary layer (thickness: 20 nm).

On the electron auxiliary layer, aluminum (Al) is vacuum-deposited to be 100 nm thick and form a second electrode, manufacturing a light emitting device. The light emitting device is evaluated with respect to electroluminescent properties, and the results are shown in Table 1.

Example 2

A light emitting device is manufactured according to the same method as Example 1 except that the coating liquid of Preparation Example 3.

The device is evaluated with respect to electroluminescent properties, and the results are shown in Table 1.

Comparative Example 1

A light emitting device is manufactured according to the same method as Example 1 except that an ethanol dispersion of the nanoparticles according to Reference Example 2 instead of the coating liquid according to Preparation Example 2 is used to form an electron auxiliary layer on the light emitting layer.

The device is evaluated with respect to electroluminescent properties, and the results are shown in Table 1.

TABLE 1

| | External Quantum Efficiency (EQE) maximum (%) | T90 (hours) |
|---|---|---|
| Example 1 | 10.7 | 17.2 |
| Example 2 | 12.1 | 16.7 |
| Comparative Example 1 | 10.6 | 9.5 |

Referring to the results of Table 1, the devices according to Examples 1 and 2 exhibit improved electroluminescent properties (maximum EQE) and a greatly increased life-span compared with the device according to Comparative Example 1.

Example 3

A device is manufactured according to the same method as Example 1 except that the thickness of the electron auxiliary layer is about 20 nm.

The device is evaluated with respect to life-span characteristics, and the results are shown in Table 2.

Comparative Example 2

A device is manufactured according to the same method as Example 3 except that instead of the coating liquid according to Preparation Example 2, the ethanol dispersion of the nanoparticles according to Reference Example 2 is used to form an electron auxiliary layer on the light emitting layer. The device is evaluated with respect to life-span characteristics, and the results are shown in Table 2.

TABLE 2

| | T90 (hours) | T50 (hours) |
|---|---|---|
| Comparative Example 2 | 11.9 | 48.3 |
| Example 3 | 24.3 | 78.7 |

Referring to the results of Table 2, the device of Example 3 exhibits improved electroluminescent properties (maximum EQE) and a greatly increased life-span compared with the device according to Comparative Example 2.

Experimental Example 2

An X-ray photoelectron spectroscopy (XPS) analysis is performed for a thin film formed of the ZnMgO particles (ZnMgO thin film) according to Reference Example 2 and a mixed thin film obtained in Preparation Example 2. The results (a mole ratio) are shown as follows.

TABLE 3

| | N:Zn | Mg:Zn |
|---|---|---|
| Example 1 | 0.10:1 | 0.28:1 |
| Comparative Example 1 | 0.00:1 | 0.27:1 |

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:
1. A light emitting device, comprising:
a light emitting layer comprising a plurality of quantum dots, and
an electron auxiliary layer disposed on the light emitting layer, the electron auxiliary layer configured to transport electrons, inject electrons into the light emitting layer, or a combination thereof,
wherein the electron auxiliary layer comprises a plurality of metal oxide nanoparticles and a nitrogen-containing metal complex,
the metal oxide nanoparticles comprise zinc, the nitrogen-containing metal complex comprises zinc, and a mole ratio of nitrogen to zinc in the electron auxiliary layer is greater than or equal to about 0.001:1 and less than or equal to 1:1.

2. The light emitting device of claim 1, wherein the metal oxide nanoparticles comprise a dopant and wherein the dopant metal comprises an alkaline metal, an alkaline-earth metal, a Group IIIB metal, a Group IVB metal, a Group IIIA metal, cobalt, tungsten, or a combination thereof.

3. The light emitting device of claim 1, wherein the plurality of quantum dots do not comprise cadmium, lead, or a combination thereof, and
wherein the plurality of quantum dots comprise a Group II-VI compound, a Group III-V compound, a Group IV-VI compound, a Group IV element or compound, a Group I-III-VI compound, a Group II-III-VI compound, a Group I-II-IV-VI compound, or a combination thereof.

4. The light emitting device of claim 1, wherein the metal oxide nanoparticles have an average particle size of greater than or equal to about 1 nanometer and less than or equal to about 10 nanometers.

5. The light emitting device of claim 1, wherein the electron auxiliary layer has a first ultraviolet absorption peak wavelength of greater than or equal to about 290 nanometers and less than or equal to about 340 nanometers.

6. The light emitting device of claim 1, wherein the nitrogen-containing metal complex further comprises magnesium, lithium, aluminum, gallium, cobalt, yttrium, nickel, or a combination thereof.

7. The light emitting device of claim 1, wherein in the electron auxiliary layer, a mole content of nitrogen per 1 mole of zinc is greater than or equal to about 0.01 and less than or equal to 1.

8. The light emitting device of claim 1, wherein in the electron auxiliary layer, a mole content of carbon per 1 mole of zinc is greater than or equal to about 0.009 and less than or equal to 6.

9. The light emitting device of claim 1, wherein the electron auxiliary layer comprises an oxygen-containing polar ligand having 6 or less carbon atoms.

10. The light emitting device of claim 9, wherein the oxygen-containing polar ligand comprises an acetate group, an acetylacetonate group, a hydroxy group, an alkoxide group, a formate moiety, or a combination thereof.

11. The light emitting device of claim 1, wherein the electron auxiliary layer comprises a nitrogen-containing polar ligand having 2 to 6 carbon atoms.

12. The light emitting device of claim 11, wherein the nitrogen-containing polar ligand comprises an alkylamine moiety, a hydroxy alkylamine moiety, or a combination thereof.

13. The light emitting device of claim 11, wherein the metal oxide nanoparticles comprise a compound represented by Chemical Formula 1:

$$Zn_{1-x}M_xO$$

wherein M is Mg, Ca, Zr, W, Li, Ti, Y, Al, Co, or a combination thereof and $0 \leq x \leq 0.5$.

14. A method of producing the device of claim 1, comprising
dissolving a first zinc precursor in an organic solvent in the presence of a nitrogen-containing multi-functional organic compound and stirring at a predetermined temperature to form a nitrogen-containing metal complex;
dispersing the nitrogen-containing metal complex and the metal oxide nanoparticles in a polar solvent to obtain a mixed coating liquid; and
coating the mixed coating liquid on the light emitting layer and removing the polar solvent.

15. The method of claim 14, wherein the nitrogen-containing multi-functional organic compound comprises a compound having 6 or less carbon atoms, the compound having 6 or less carbon atoms comprising an amine group and a hydroxyl group.

16. The light emitting device of claim 1, wherein the nitrogen-containing zinc metal complex is represented by Chemical Formula 2:

$$ZnM_a(L1)_x(L2)_y \qquad \text{Chemical Formula 2}$$

wherein
M is Mg, Ca, Zr, W, Li, Ti, Y, Al, Co, or a combination thereof,
L1 represents a C6 or less oxygen-containing organic ligand,
L2 represents a C6 or less nitrogen-containing organic ligand,
L1 and L2 are not linked to each other or are optionally linked to each other,
a, x, and y represent a number of moles of M, L1, and L2 relative to zinc, respectively, and
wherein $0 \leq a \leq 1$,
$0 \leq x \leq 1$, and
$0 \leq y \leq 1$, provided that x and y are not zero simultaneously.

17. The light emitting device of claim 16, wherein
the L1 comprises an acetate group, an alkoxide group, a hydroxy group, a formate group, an acetylacetonate group, or a combination thereof, or
the L2 comprises an alkylamine moiety, an ammonium salt moiety, or a combination thereof.

18. The light emitting device of claim 1, wherein in the electron auxiliary layer, a mole content of carbon per 1 mole of zinc is greater than or equal to about 0.01.

19. The light emitting device of claim 1, wherein in the electron auxiliary layer, a content of the nitrogen-containing zinc complex is less than or equal to about 50 weight percent, based on the total weight of the layer.

20. A display device comprising the light emitting device of claim 1.

* * * * *